United States Patent
Jiang

(10) Patent No.: US 10,186,678 B2
(45) Date of Patent: Jan. 22, 2019

(54) ORGANIC LIGHT-EMITTING DIODE COMPONENT AND ORGANIC LIGHT-EMITTING DIODE DISPLAY

(71) Applicant: Shenzhen China Star Optoelectronics Technology Co., Ltd., Shenzhen, Guangdong (CN)

(72) Inventor: Zhixiong Jiang, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 88 days.

(21) Appl. No.: 15/504,024

(22) PCT Filed: Jan. 17, 2017

(86) PCT No.: PCT/CN2017/071329
§ 371 (c)(1),
(2) Date: Feb. 15, 2017

(87) PCT Pub. No.: WO2018/120327
PCT Pub. Date: Jul. 5, 2018

(65) Prior Publication Data
US 2018/0219169 A1    Aug. 2, 2018

(30) Foreign Application Priority Data
Dec. 26, 2016   (CN) .......................... 2016 1 1218916

(51) Int. Cl.
*H01L 51/52* (2006.01)
*H01L 51/50* (2006.01)
(52) U.S. Cl.
CPC ...... *H01L 51/5203* (2013.01); *H01L 51/5056* (2013.01); *H01L 51/5072* (2013.01)
(58) Field of Classification Search
USPC .......................... 313/498–512; 428/690, 917
See application file for complete search history.

(56) References Cited

U.S. PATENT DOCUMENTS

2009/0026929 A1   1/2009 Song
2010/0134456 A1*  6/2010 Oyamada ............... B82Y 10/00
                                                                345/207
(Continued)

FOREIGN PATENT DOCUMENTS

CN    1716650 A    1/2006
CN  101636856 A    1/2010
(Continued)

*Primary Examiner* — Ashok Patel
(74) *Attorney, Agent, or Firm* — Andrew C. Cheng

(57) ABSTRACT

The present disclosure discloses an OLED component, comprising: a substrate, a bottom electrode arranged on the substrate, a top electrode opposite to the bottom electrode, and the top electrode spaced apart from the bottom electrode; an organic electroluminescence element arranged between the bottom electrode and the top electrode; at least one buffer element disposed between the top electrode and the organic electroluminescence element, and/or between the bottom electrode and the organic electroluminescence element, wherein the buffer element is configured to enhance carrier balance and, electrons transport performance and holes transport performance. The present disclosure enhances the luminous efficiency by the way of disposing the buffer element which is configured to enhance carrier balance, a electrons transport performance and holes transport performance between the top electrode and the organic electroluminescence element, and/or between the bottom electrode and the organic electroluminescence element.

8 Claims, 3 Drawing Sheets

(56) References Cited

U.S. PATENT DOCUMENTS

| | | | |
|---|---|---|---|
| 2014/0014933 A1* | 1/2014 | Sasaki | H01L 51/5044 |
| | | | 257/40 |
| 2014/0117332 A1 | 5/2014 | Lee | |
| 2014/0322478 A1* | 10/2014 | Mori | H01L 51/5246 |
| | | | 428/76 |
| 2015/0001519 A1* | 1/2015 | Matsuura | H01L 33/38 |
| | | | 257/40 |
| 2016/0254474 A1* | 9/2016 | Zou | H01L 51/5221 |
| | | | 257/40 |

FOREIGN PATENT DOCUMENTS

| | | |
|---|---|---|
| CN | 101814585 A | 8/2010 |
| CN | 102074658 A | 5/2011 |
| CN | 104124378 A | 10/2014 |
| WO | WO2011099606 A1 | 8/2011 |

\* cited by examiner

ORGANIC LIGHT-EMITTING DIODE COMPONENT AND ORGANIC LIGHT-EMITTING DIODE DISPLAY

BACKGROUND OF THE INVENTION

1. Field of the Invention

The present disclosure relates to electroluminescence field, and more particularly, to an organic light-emitting diode (OLED) component and an OLED display.

2. Discussion of the Related Art

OLED has recently become a popular flat display product due to attributes such as self-luminous, wide viewing angle (up to 175 degree), short response time (1 μs), high luminous efficiency, wide color gamut, low operating voltage (3~10V), thin thickness (less than 1 mm), capable of being made in a large size, flexible panel and simple manufacturing process, and low-cost.

Currently, OLEDs includes a multilayer structure with different functions. The inherent properties of the adopted material in each layer structure and the compatibility between layers are essential. The multilayer structure typically includes a hole injection layer (HIL), a hole transport layer (HTL), a emitting layer (EML), an electron transport layer (ETL), and an electron injection layer (EIL). However, the multilayer structure has drawbacks such as low hole transport rate, low electron transport layer rate, and electrons and holes being difficult to maintain balance, which cause low device efficiency. In addition, if a top electrode is made of metal material, the electron transport layer contacts with the top electrode directly, metal atoms can easily enter the electron transport layer and become an exciton quenching center during the deposition process such that decrease the efficiency and lifetime of the device.

SUMMARY

To solve the problem mentioned above, the purpose of the present disclosure is to provide an OLED component configured to enhance hole and/or electron transport rate and carrier balance, and an OLED display having the OLED component.

In one aspect, an organic light-emitting diode (OLED) component includes: a substrate;

a bottom electrode arranged on the substrate; a top electrode opposite to the bottom electrode, and the top electrode is spaced apart from the bottom electrode; an organic electroluminescence element arranged between the bottom electrode and the top electrode; at least one buffer element disposed between the top electrode and the organic electroluminescence element, and/or between the bottom electrode and the organic electroluminescence element, wherein the buffer element is configured to enhance carrier balance and a transport performance of electrons and holes.

Wherein the buffer element is made of a mixture of a P-type semiconductor material and an N-type semiconductor.

Wherein the P-type semiconductor material includes at least one of copper phthalocyanine, pentacene, tetracene, NPB, and TPBI; and the N-type semiconductor material includes at least one of C60, perylene anhydride, perylene diamide, and molybdenum oxide.

Wherein a mixing ratio of the P-type semiconductor material and the N-type semiconductor material is from in a range from 8:1 to 1:8.

Wherein the organic electroluminescence element includes: a hole injection layer, a hole transport layer, an emitting layer, an electron transport layer, and an electron injection layer arranged along a direction from the bottom electrode to the top electrode.

Wherein the organic electroluminescence element includes: a hole transport layer, an emitting layer, an electron transport layer, and an electron injection layer arranged along a direction from the bottom electrode to the top electrode when the buffer element is disposed only between the bottom electrode and the organic electroluminescence element.

Wherein the organic electroluminescence element includes: a hole injection layer, a hole transport layer, an emitting layer, and an electron transport layer arranged along a direction from the bottom electrode to the top electrode when the buffer element is disposed only between the top electrode and the organic electroluminescence element.

Wherein the organic electroluminescence element includes: a hole transport layer, an emitting layer, and an electron transport layer arranged along a direction from the bottom electrode to the top electrode when the buffer elements are disposed between the top electrode and the organic electroluminescence element as well as disposed between the bottom electrode and the organic electroluminescence element.

Wherein one of the bottom electrode and the top electrode is transparent or translucent, and the other one of the bottom electrode and the top electrode is opaque and reflective.

In the view of above, the present disclosure enhances the luminous efficiency by disposing a buffer element which is configured to enhance carrier balance and electrons holes transport performance between a top electrode and an organic electroluminescence element, and/or between a bottom electrode and the organic electroluminescence element.

BRIEF DESCRIPTION OF THE DRAWINGS

The above and other aspects, features and advantages of the embodiments of the present disclosure will become more apparent from the following description with the accompanying drawings, in the drawings.

DETAILED DESCRIPTION OF THE EMBODIMENTS

Figure 1:
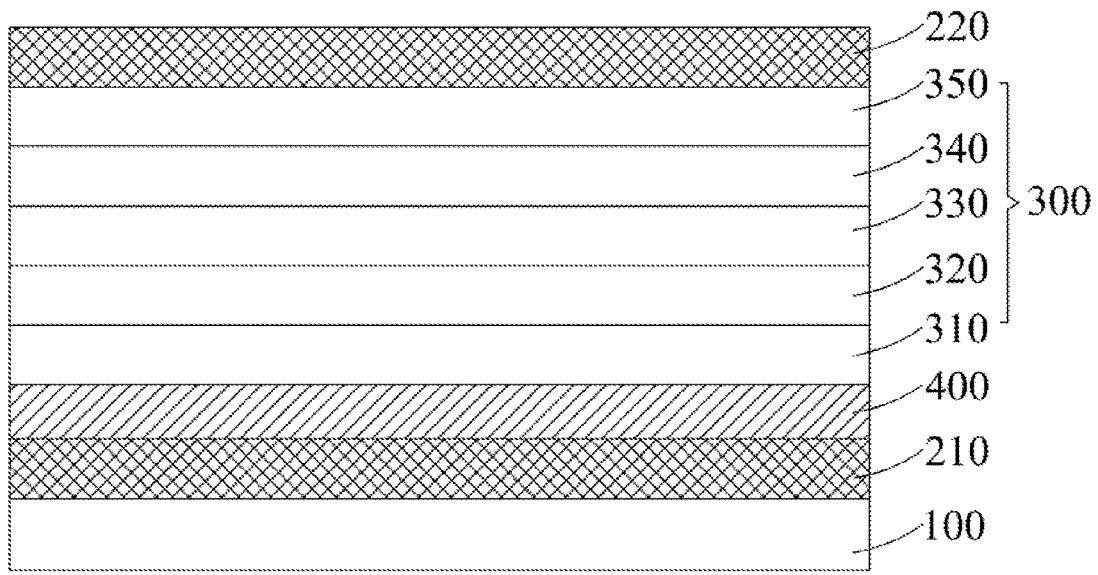
FIG. 1 is the schematic view of an OLED component in accordance with first embodiment of the claimed invention.

Following embodiments of the invention will now be described in detail hereinafter with reference to the accompanying drawings. However, there are plenty of forms to implement the present disclosure, and the invention should not be construed as limitation to the embodiments. Rather, these embodiments are provided to explain the principles of the invention and its practical application, thereby enabling other person skilled in the art to understand each of the embodiments in the invention and various modifications being suitable for the particular application.

In the drawings, the thicknesses of layers and regions may be exaggerated for clarity. Same reference numerals refer to the same components throughout the specification and the drawings.

An organic electroluminescence element (also called an organic EL element) refers to one or more organic layers between two electrodes that emit light when a voltage is applied.

FIG. 1 is the schematic view of an OLED component according to the first embodiment of the present disclosure.

Refer to FIG. 1, according to the first embodiment in the present disclosure, the OLED component includes: a substrate 100, a bottom electrode 210 arranged on the substrate 100, a top electrode 220 opposite to the bottom electrode 210, and the top electrode 220 is spaced apart from the bottom electrode 210, an organic electroluminescence element 300 arranged between the bottom electrode 210 and the top electrode 220, and at least one buffer element 400 disposed between the bottom electrode 210 and the organic electroluminescence element 300, wherein the buffer element 400 is configured to enhance the holes transport performance (also called hole transport rate), and the buffer element 400 is also configured to enhance carrier balance (also called carrier balance coefficient) thereby to enhance the emit efficiency of the OLED component The substrate 100 may be transparent or translucent. The substrate 100 has light transmission property as viewing the emitting organic electroluminescence assembly from the substrate 100. In this case, transparent glass or plastic is adopted. The substrate 100 may be light-transmitting, light-absorbing or reflective, as viewing the emitting organic electroluminescence assembly from the top electrode 220. In this case, the material of the substrate 100 may be, but not limited, glass, plastic, semiconductor material, ceramic, circuit board material, or any other suitable material.

The bottom electrode 210 is usually provided as an anode. The bottom electrode 210 is also a reflector and may be made of reflective metal and supposed to be thin enough to have partial transmittance under the wavelength of the emitted light as viewing the emitting organic electroluminescence assembly from the substrate 100, which is referred to as translucent. Or the bottom electrode 210 may be made of transparent metal oxide, such as indium tin oxide or zinc tin oxide. The bottom electrode 210 may be made of reflective metal and supposed to be thick enough to be opaque and be a full reflector as viewing the emitting substantially organic electroluminescence assembly from the top electrode 220.

The top electrode 220 is usually provided as a cathode. The top electrode 220 is also a reflector and may be made of reflective metal and supposed to be thin enough to have partial transmittance under the wavelength of the emitted light as viewing the emitting organic electroluminescence assembly from the top electrode 220. Or the bottom electrode 210 may be made of transparent metal oxide, such as indium tin oxide or zinc tin oxide. The bottom electrode 210 may be made of reflective metal and supposed to be thick enough to be opaque and be a full reflector as viewing the emitting substantially organic electroluminescence assembly from the substrate 100.

In this embodiment, the organic electroluminescence element 300 includes: a hole injection layer (HIL) 310, a hole transport layer (HTL) 320, an emitting layer (EML) 330, an electron transport layer (ETL) 340 and an electron injection layer (EIL) 350 arranged along a direction from the bottom electrode to the top electrode, such layer structures may be made of a suitable material, and will not be described here.

The buffer element 400 is made of a mixture of a P-type semiconductor material and an N-type semiconductor, and the buffer element 400 has a higher hole and electron concentration.

A mixing ratio of the P-type semiconductor material and the N-type semiconductor material may be 8:1, 4:1, 3:1, 3:2, 1:1, 1:3, 2:3, 1:4 or 1:8.

The P-type semiconductor material includes at least one of copper phthalocyanine, pentacene, tetracene, NPB, and TPBI; the N-type semiconductor material includes at least one of C60, perylene anhydride, perylene diamide, and molybdenum oxide.

The buffer element 400 can be a blended buffer layer film formed by mixing the P-type semiconductor material and the N-type semiconductor material through a pluralism simultaneous deposition processes. The buffer element 400 may be made from a solution processing process which the solution in the process is a blending solution formed by P-type semiconductor material and the N-type semiconductor material.

Such buffer element 400 is a hybrid system. Interactions exist within the entire buffer element 400 and at the interface of the P-type semiconductor and the N-type semiconductor. In this way, electrons are accumulated on the N-type semiconductor side; holes are accumulated on the P-type semiconductor side. Under a certain voltage, the electrons and holes are transferred to the positive and negative electrodes, respectively. A large current is formed to increase the electronic current of the component, thereby to enhance the carrier balance, luminous brightness, and current efficiency. And due to the addition of the buffer element 400, luminescent center is remote from the electrode, thereby to reduce the metal ion exciton quenching and enhancing component efficiency, relatively.

On the contrary, for the organic component which is dominated by electrons, the buffer element 400 may apply on the anode side, thereby to enhance the carrier balance, luminous brightness and current efficiency, the principle is same as above.

Figure 2:
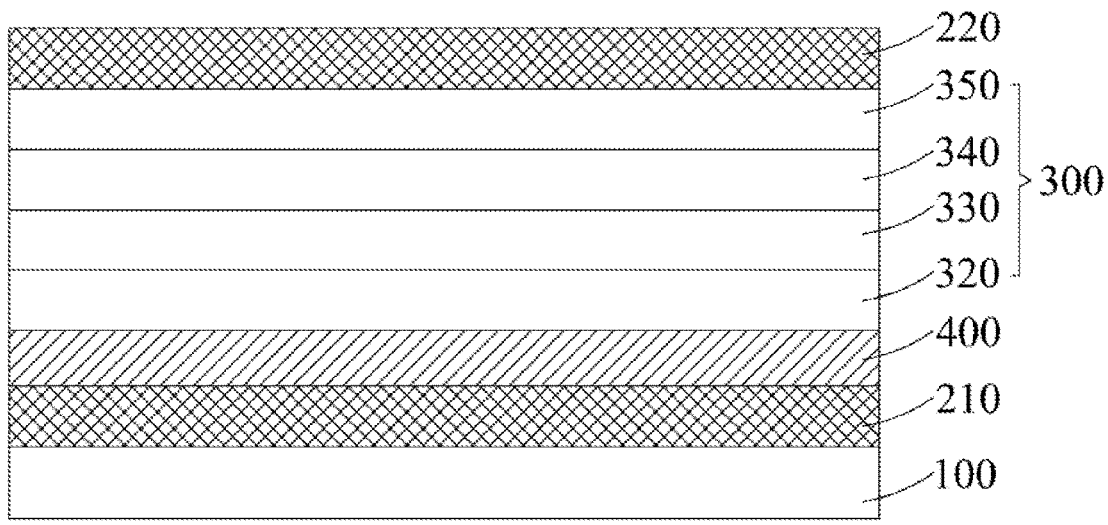
FIG. 2 is the schematic view of the OLED component in accordance with the second embodiment of the claimed invention.

FIG. 2 is the schematic view of the OLED component in accordance to the second embodiment of the present disclosure.

Refer to FIG. 2, difference between the second embodiment and the first embodiment shown in FIG. 1 relies on the organic electroluminescence element 300, which includes: the hole transport layer (HTL) 320, the emitting layer (EML) 330, the electron transport layer (ETL) 340 and the electron injection layer (EIL) 350 arranged along the direction from the bottom electrode to the top electrode, that is, the hole injection layer (HIL) 310 may be omitted in second embodiment, because the buffer element 400 also has a high hole concentration, which can replace the functional effect of the hole injection layer 310.

Figure 3:
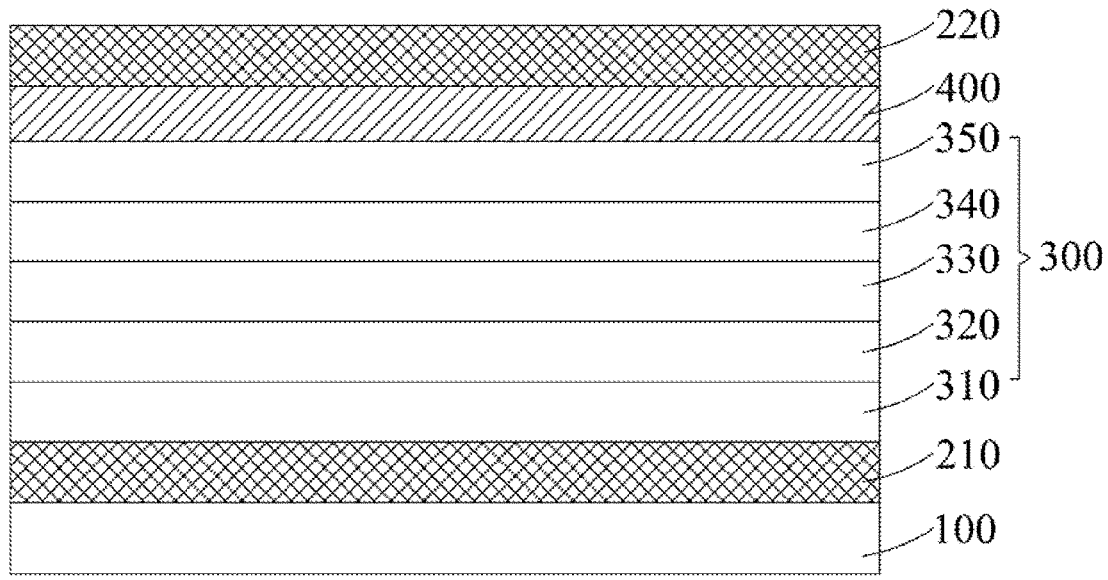
FIG. 3 is the schematic view of the OLED component in accordance with the third embodiment of the claimed invention.

FIG. 3 is the schematic view of the OLED component in accordance with the third embodiment of the present disclosure.

Refer to FIG. 3, difference between the third embodiment and the first embodiment shown in FIG. 1 relies on the buffer element 400, which is arranged between the top electrode 220 and the organic electroluminescence element 300, and the buffer element 400 is configured to enhance electrons transport performance (also called electron transport rate), and the buffer element 400 is also configured to enhance carrier balance (also called carrier balance coefficient) thereby to enhance the emit efficiency of the OLED component.

When the top electrode 220 is made of metal material, the buffer element 400 can block the metal atoms from entering the organic electroluminescence element 300 during a depositing process, an efficiency reduction of the light emitting element 300 caused by metal atom quenching center may be avoided.

Figure 4:
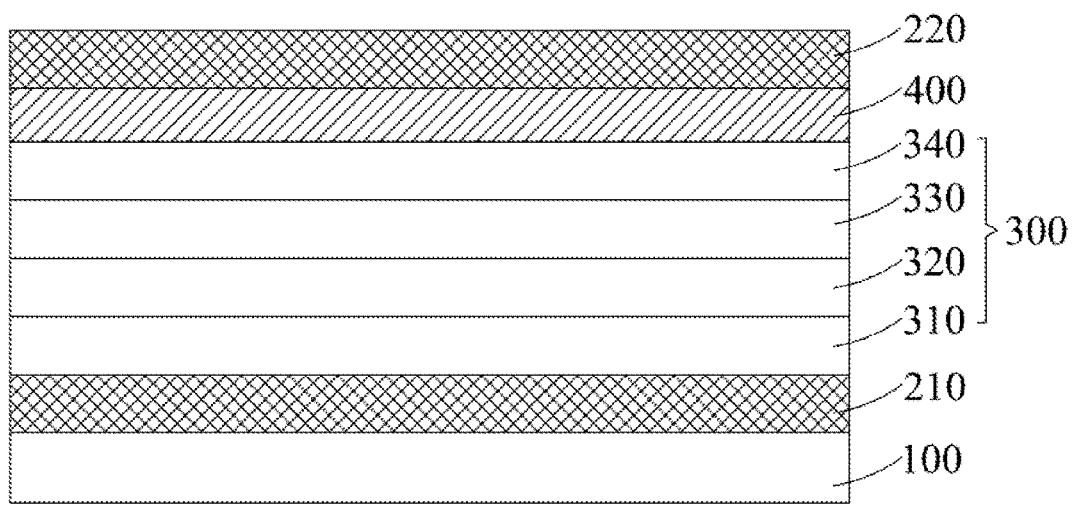
FIG. 4 is the schematic view of the OLED component in accordance with the forth embodiment of the claimed invention.

FIG. 4 is the schematic view of the OLED component in accordance with the forth embodiment of the present disclosure.

Refer to FIG. 4, difference between the forth embodiment and the third embodiment shown in FIG. 3 relies on the organic electroluminescence element 300, which includes: the hole injection layer (HIL) 310, the hole transport layer (HTL) 320, the emitting layer (EML) 330 and the electron transport layer (ETL) 340 arranged along the direction from the bottom electrode to the top electrode, that is, the electron injection layer (EIL) 350 may be omitted in forth embodiment, because the buffer element 400 also has a high hole concentration, which can replace the functional effect of the electron injection layer (EIL) 350.

Figure 5:
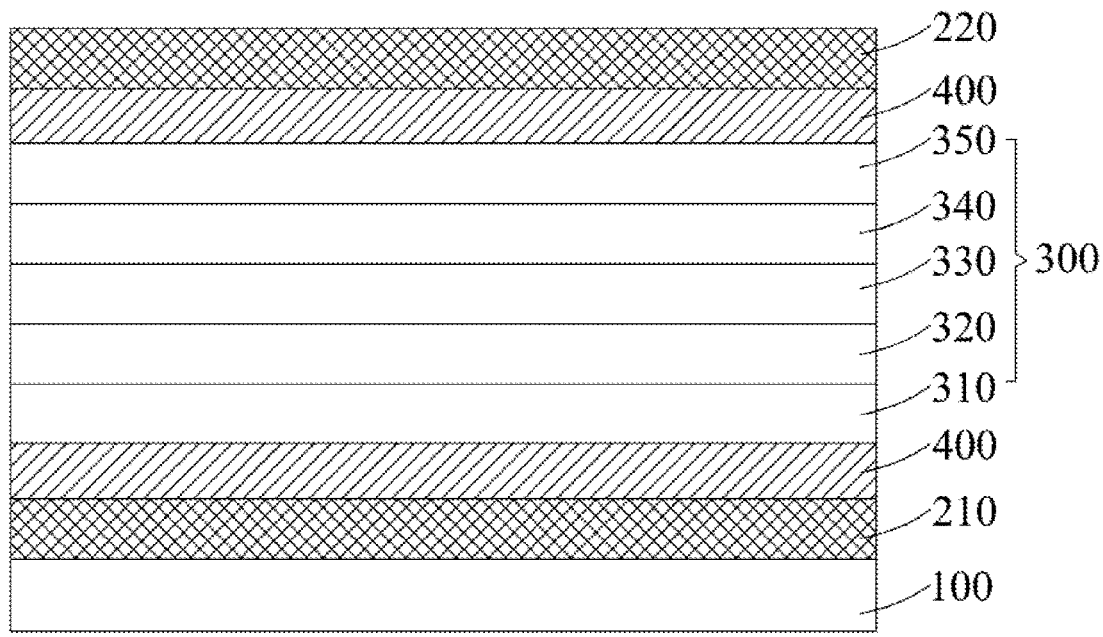
FIG. 5 is the schematic view of the OLED component in accordance with the fifth embodiment of the claimed invention.

FIG. 5 is the schematic view of the OLED component in accordance with the fifth embodiment of the present disclosure.

Refer to FIG. 5, difference between the fifth embodiment and the first embodiment shown in FIG. 1 relies on the buffer elements 400, which is also arranged between the top electrode 220 and the organic electroluminescence element 300. The buffer element 400 is also configured to enhance electrons transport performance (also called electron transport rate), and the buffer element 400 is also configured to enhance carrier balance (also called carrier balance coefficient) thereby to enhance the emit efficiency of the OLED component.

When the top electrode 220 is made of metal material, the buffer element 400 can block the metal atoms from entering the organic electroluminescence element 300 during a depositing process, an efficiency reduction of the light emitting element 300 caused by metal atom quenching center may be avoided.

Figure 6:
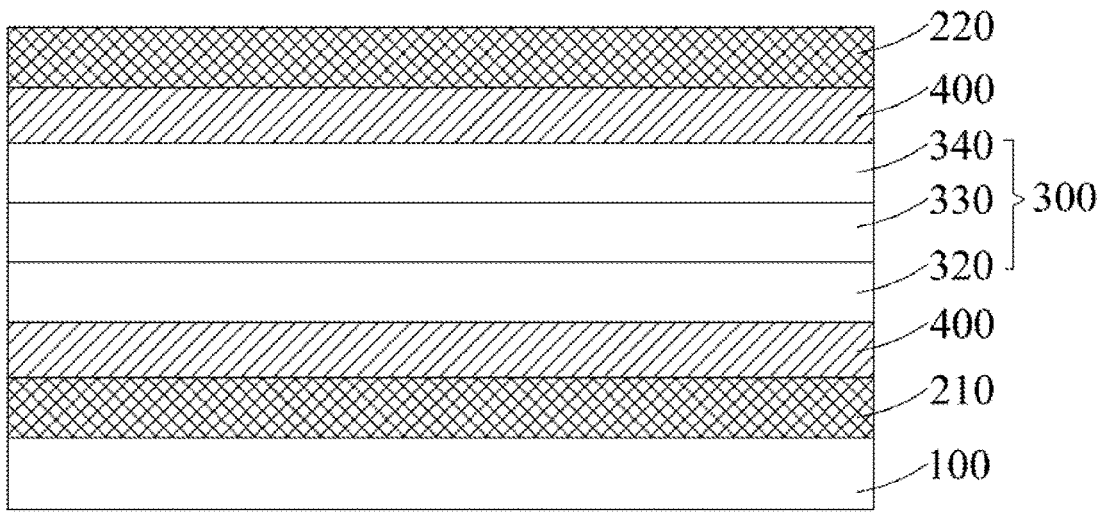
FIG. 6 is the schematic view of the OLED component in accordance with the sixth embodiment of the claimed invention.

FIG. 6 is the schematic view of the OLED component in accordance with the sixth embodiment of the present disclosure.

Refer to FIG. 6, difference between the sixth embodiment and the fifth embodiment shown in FIG. 5 relies on the organic electroluminescence element 300, which includes: the hole transport layer (HTL) 320, the emitting layer (EML) 330 and the electron transport layer (ETL) 340 arranged along the direction from the bottom electrode to the top electrode, that is, the hole injection layer (HIL) 310 and the electron injection layer (EIL) 350 may be omitted in fifth embodiment, because the buffer element 400 also has a high hole concentration, which can replace the functional effect of the hole injection layer (HIL) 310 and the electron injection layer (EIL) 350.

Although the present disclosure has been explained referring to the specific embodiment, the person skilled in the art should understand: without departing from the spirit and scope of the invention as defined by the appended claims and their equivalents, various changes in form and detail may be made therein.

What is claimed is:

1. An organic light-emitting diode (OLED) component, comprising:
    a substrate;
    a bottom electrode arranged on the substrate;
    a top electrode opposite to the bottom electrode, and the top electrode is spaced apart from the bottom electrode;
    an organic electroluminescence element arranged between the bottom electrode and the top electrode, and the organic electroluminescence element comprising a hole transport layer, an emitting layer , an electron transport layer being stacked in sequence;
    buffer elements disposed between the top bottom electrode and the organic electroluminescence element, and between the bottom electrode and the organic electroluminescence element.

2. The OLED according to claim 1, wherein the buffer element is made of a mixture of a P-type semiconductor material and an N-type semiconductor.

3. The OLED according to claim 2, wherein the P-type semiconductor material comprises at least one of copper phthalocyanine, pentacene, tetracene, NPB, and TPBI;
    the N-type semiconductor material comprises at least one of C60, perylene anhydride, perylene diamide, and molybdenum oxide.

4. The OLED according to claim 2, wherein a mixing ratio of the P-type semiconductor material and the N-type semiconductor material is from in a range from 8:1 to 1:8.

5. The OLED according to claim 2, wherein one of the bottom electrode and the top electrode is transparent or translucent, and the other one of the bottom electrode and the top electrode is opaque and reflective.

6. The OLED according to claim 1, wherein one of the bottom electrode and the top electrode is transparent or translucent, and the other one of the bottom electrode and the top electrode is opaque and reflective.

7. An OLED display comprising:
    an OLED component, wherein the OLED component comprises:
    a substrate, a bottom electrode arranged on the substrate, a top electrode opposite to the bottom electrode, and the top electrode is spaced apart from the bottom electrode;
    an organic electroluminescence element arranged between the bottom electrode and the top electrode, and the organic electroluminescence element comprising a hole transport layer, an emitting layer, an electron transport layer being stacked in sequence;
    buffer elements disposed between the top electrode and the organic electroluminescence element, and between the bottom electrode and the organic electroluminescence element.

8. The OLED display according to claim 7, wherein the buffer element is made of a mixture of a P-type semiconductor material and an N-type semiconductor.

* * * * *